(12) United States Patent
Cunningham et al.

(10) Patent No.: US 6,346,700 B1
(45) Date of Patent: Feb. 12, 2002

(54) DELTA-DOPED HYBRID ADVANCED DETECTOR FOR LOW ENERGY PARTICLE DETECTION

(75) Inventors: Thomas J. Cunningham, Pasadena; Eric R. Fossum, La Crescenta; Shouleh Nikzad, Valencia; Bedabrata Pain, Pasadena; George A. Soli, La Canada, all of CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/546,837

(22) Filed: Apr. 11, 2000

Related U.S. Application Data

(62) Division of application No. 09/114,346, filed on Jul. 13, 1998, now Pat. No. 6,107,619.
(60) Provisional application No. 60/052,382, filed on Jul. 14, 1997.

(51) Int. Cl.[7] .................................................. H01L 31/00
(52) U.S. Cl. .............................. 250/214.1; 250/208.1; 250/216
(58) Field of Search .............................. 250/216, 214.1, 250/214 R, 208.1, 338.4, 339.02, 370.08; 257/463, 452, 443, 457–459

(56) References Cited

U.S. PATENT DOCUMENTS

| | | | | |
|---|---|---|---|---|
| 5,308,980 A | * | 5/1994 | Barton | 250/338.4 |
| 5,610,389 A | * | 3/1997 | Asatourian | 250/216 |

* cited by examiner

*Primary Examiner*—Que T. Le
(74) *Attorney, Agent, or Firm*—Fish & Richardson P.C.

(57) ABSTRACT

A delta-doped hybrid advanced detector (HAD) is provided which combines at least four types of technologies to create a detector for energetic particles ranging in energy from hundreds of electron volts (eV) to beyond several million eV. The detector is sensitive to photons from visible light to X-rays. The detector is highly energy-sensitive from approximately 10 keV down to hundreds of eV. The detector operates with milliwatt power dissipation, and allows non-sequential readout of the array, enabling various advanced readout schemes.

11 Claims, 7 Drawing Sheets

DELTA-DOPED HYBRID ADVANCED DETECTOR FOR LOW ENERGY PARTICLE DETECTION

CROSS REFERENCE TO RELATED APPLICATIONS

This application claims the benefit of the U.S. Provisional Application Nos. 60/052,382, filed on Jul. 14, 1997, which is incorporated herein by reference. This is a divisional of U.S. application Ser. No. 09/114,346, filed Jul. 13, 1998 now U.S. Pat. No. 6,107,619.

STATEMENT AS TO FEDERALLY SPONSORED RESEARCH

The invention described herein was made in the performance of work under a NASA contract, and is subject to the provisions of Public Law 96-517 (35 U.S.C. 202) in which the Contractor has elected to retain title.

BACKGROUND AND SUMMARY OF THE INVENTION

When an energetic particle passes through silicon, a trail of electron-hole pairs is created along the particle's path. Similarly, X-ray photons produce a cloud of electron-hole pairs near the location of the photon's absorption. For high energy particles and X-rays (above 10 keV), it has been observed that one electron-hole pair is created for every 3.61 eV of energy deposited in the silicon. This value comes from the 1.1 eV required to raise an electron over the silicon band gap, plus the kinetic energy of the electron and hole required by the quantum mechanical rules of momentum conservation. This means that the amount of charge generated by a particle is directly proportional, within a statistical variation, to the energy lost by a particle in the silicon (for particles that pass completely through the silicon) or to the particle's total energy (for particles that stop in the silicon). Particle energies can therefore be found from the number of generated electron-hole pairs. The particle's direction of incidence can be also be found, by constructing a "pin-hole camera" and dividing the detector into individual pixels. The direction is found by determining in which pixel the charge was collected.

The detection of single low energy particles (such as protons with energies between 100 eV and 10 keV found in the solar wind) typically requires a detector that can collect the charge produced by such particles and which can then be read out with sufficient signal to noise ratio. When low energy particles enter a silicon detector, they tend to create a charge cloud very near the surface. Surface fields in ordinary silicon detectors tend to sweep this charge cloud to the surface where it is captured by surface states and neutralized by recombination before it can be collected for detection. In addition, conventional readout schemes are often too noisy and too slow to allow for adequate resolution of particle energies and complete separation of individual particle events. Finally, many detector schemes require thinning of the silicon detector material, which can be difficult, expensive, and time consuming.

FIG. 1 shows a silicon "PIN" diode structure 10 used as a particle detector. One region 12 is doped p-type, and another region 14 is n-type. Between them in an "intrinsic" region 16 that is very lightly doped. The term "PIN" describes this p-type, intrinsic, n-type layer structure. By applying a negative potential 18 to the p-type region and a positive potential to the n-type region, an electric field is created that depletes the it intrinsic region of any free electrons or holes. After the initial depletion, no current normally flows, since the region between the conducting n-type and p-type regions is depleted of carriers.

When a particle or photon is absorbed in the intrinsic region, the electron-hole pairs that the particle generates are swept away from the intrinsic region, with the holes going toward the p-type region and the electrons toward the n-type region. The total number of electron-hole pairs produced is proportional to the particle's incident energy. This creates a current flow that can be detected by detector 11. Alternatively, the collected charge can be collected by a capacitor, producing a detectable voltage.

Several parameters affect device performance, including dead layer thickness, depletion region thickness, device capacitance, and readout speed and flexibility.

Dead-Layer Thickness

As an energetic particle penetrates silicon, it gradually loses its energy and generates electron-hole pairs. The electron-hole pairs generated in the depletion region will be separated by the applied electric field and detected. However, the depletion region does not extend completely to the surface. There is a "dead layer" near the surface, and electron-hole pairs generated in this region will be collected with only limited efficiency, or not at all. This is particularly important for the detection of low energy particles, since low energy particles penetrate only a short distance into the silicon before their energy is dissipated, and thus all of the electron-hole pair generation is relatively near the surface.

The dead layer has two components, the undepleted silicon layer and the surface depletion layer. The undepleted layer includes the n-type or p-type layer in the PIN structure that is not depleted by the applied electric field. Some thickness of undepleted silicon is needed to serve as a contact in order to apply the electric field. Since it is undepleted, this region is field free, and there is an abundance of majority carriers, both factors contributing to loss of signal. The abundance of majority carriers makes it likely for generated minority carriers to recombine as long as they remain in the region. The lack of an electric field also means that the device must rely on diffusion alone to remove minority carriers from the region. This means a significant fraction of the generated minority carriers will not be detected, but will remain in the undepleted region until they recombine.

There will also be a region at the surface depleted by the surface states. In contrast to the main depletion region set up by the applied electric field, the electric field that exists in the surface depletion region drives generated carriers to the surface or to the undepleted region where they recombine, rather than to the opposite electrodes where they can be detected.

Depletion Layer Thickness

The thickness of the main depletion region determines the fraction of charge collected for high energy particles and the collection efficiency for hard X-rays. If the material is too thin, high energy particles will travel completely through the depletion region without being stopped, and so only a fraction of their energy will be deposited there. Similarly, a thin depletion layer will provide a small collection volume for high energy X-rays, and a significant fraction of the X-ray photons will not be detected, instead being either completely transmitted or absorbed in insensitive parts of the detector.

Also, for back illuminated devices, the generated carriers must travel from the back to the front side without recombining. This requires that the device be depleted from the front to the back. The thickness of the wafer must be such that it can be depleted from front to back with a practical applied voltage.

Device Capacitance

The amount of charge collected is dependent on the energy of the particle or photon. This produces a voltage equal to the charge divided by the capacitance of the detector: The larger the capacitance, the smaller the voltage signal for a given collected charge. Since the readout electronics normally have a fixed noise voltage, and the voltage signal must be larger than this voltage noise for proper discrimination, the detector capacitance determines the minimum detectable charge for a given readout voltage noise.

Readout Speed and Flexibility

The particles impinge randomly on the detector array, each particle generating a charge proportional to its energy. If the collector detects 1000 electrons in one read cycle, however, it cannot discriminate between 1 particle that generates 1000 electrons, or 10 particles that each generate 100 electrons. Therefore, the detector readout must be fast enough so that only one (or at most a few) events happen per each pixel per readout cycle.

A delta-doped hybrid advanced detector ("HAD") is provided which includes a diode array formed from high resistivity silicon. A high energy particle passing through the silicon generates a cloud of electron-hole pairs that can be collected as signal charge. The construction of the detector allows the detector to see low energy particles and high energy particles simultaneously.

The detector uses the delta-doping scheme first developed for delta-doped charge coupled devices ("CCDs"). Delta-doping places a highly doped layer at the surface to terminate surface drift fields, thereby enabling the collection of the charge generated by low energy particles, these tending to be generated very near the detector surface.

Second, in contrast to a CCD, the HAD uses a high resistivity bulk crystal. Given the doping levels used in typical CCDs, CCDs require thinning to allow the depleted charge-collecting region to extend throughout the thickness of the device. The high resistivity diodes of the HAD can accomplish this without requiring thinning, eliminating a difficult processing step as well as leaving a large collection volume for detecting X-rays and high energy particles that deposit charge deep within the detector.

The HAD is bump-bonded to a CMOS active pixel sensor ("APS") type readout. This provides sufficient sensitivity to resolve the small signal generated by low energy particles while allowing a low power, high speed, non-sequential readout.

A new pixel guarding technique may be used to preserve a low effective input capacitance on the APS readout, even with relatively large bump bond pads on the input node. This preserves the high conversion gain which results in high sensitivity with a high signal to noise ratio.

The delta-doped HAD according to the present invention is made by combining the advantages of at least three technologies: high-resistivity silicon strip detectors, delta-doped CCDs, and active pixel sensors.

Silicon strip detectors are made from strips of high resistivity (low doped) silicon detectors wire bonded to external amplifier arrays. They are the current state-of-the-art for pixelated high energy particle detectors. Because of the low doping, the entire thickness of the chip can be depleted without requiring thinning. This gives them a large volume for the detection of high energy particles and X-rays. In fact, they are sensitive to particles to beyond MeV energies on the high end. However, they have a relatively thick dead layer at the surface, which limits their sensitivity on the low end to greater than 10 keV energies. They have relatively large capacitances on the order of 1 pF due to the size of the strip and parasitic capacitance associated with the wire bond. This limits their noise equivalent signal to several thousand electrons (rms).

A delta-doped CCD refers to a thinned CCD which has a delta-doped layer put on the backside. Silicon MBE is used to grow a thin layer of epitaxial silicon on the back side which contains a very high concentration of dopants in a single atomic sheet. This single atomic layer of high doping is referred to as "delta-doping" drawing on an analogy to the mathematical delta function. The dopant layer can be placed within 5 or 10 Å of the detector surface, and is only a single atomic layer thick. It provides a very thin undepleted region and additionally terminates surface fields to limit the thickness of the surface depletion region. The result is a dead layer of only 15 to 20 Å that allows the collection of electron-hole pairs created beyond 20 Å of the surface by low energy particles or UV photons.

However, the silicon used in CCD structures is usually highly doped compared to high-resistivity silicon strip detectors. This requires thinning to allow the depletion region to extend from the front to the back. In addition to requiring an additional processing step, back-illuminated CCDs have a thin depletion region compared to strip detectors, making them less sensitive to high energy particles and X-rays.

For their readout, CCDs shift collected charge laterally, and can shift it to a low capacitance readout node, typically allowing an equivalent noise of approximately 5 electrons rms for scientific CCDs. However, a 1000×1000-pixel CCD array requires several thousand sequential lateral transfers to shift the charge from the end pixel to the readout node. This makes CCDs relatively slow and causes them to dissipate a relatively large amount of power.

An APS is made using the complementary metal oxide silicon ("CMOS") process and/or other techniques, such as NMOS, that are compatible with CMOS. Since this is the standard technology used for the fabrication of computer chips and analog integrated circuits, industrial foundries exist that can fabricate APS chips, requiring only a computer-generated layout design file. The CMOS process can be used to make integrated circuit diodes, as well as n-channel and p-channel field-effect transistors. The APS is ordinarily a visible imager technology: An integrated photodiode or photogate collects image charge produced by visible light, and the signal receives power amplification from a single transistor amplifier in each pixel. Two additional transistor switches are used in the pixel. One connects each pixel in turn to a readout line, allowing circuitry to raster scan through the array. The other transistor drains away collected charge to reset the pixel after the readout is completed.

The capacitance of the APS readout node is small, allowing readout noise performance comparable to a CCD. It can be read out faster than a CCD, and with considerably less power. In addition, the readout can be custom designed for features such as windowing, or reading out only those pixels above a certain threshold.

Presently, the APS has both a thick dead layer and thin depletion region, making it a relatively poor particle detector. Although it has not been done, it is possible to thin and delta-dope an APS, similar to what is done for a delta-doped CCD.

The delta-doped HAD of the present invention extends the low energy limit of detectable particles from about 10 keV at least down to hundreds of eV, while still maintaining the ability to detect high energy particles with energies beyond MeV. The HAD is also sensitive to photons over a wide energy range from visible through UV and into the hard X-rays. The HAD has an equivalent readout noise of 5 to 20 electrons rms, as opposed to thousands of electrons rms for strip detectors. The HAD dissipates milliwatts, as opposed to watts for a CCD, and can have a fast and flexible readout, as opposed to the strictly sequential readout available from a CCD.

Other advantages will be apparent from the description below and the figures.

DETAILED DESCRIPTION

Figure 1:
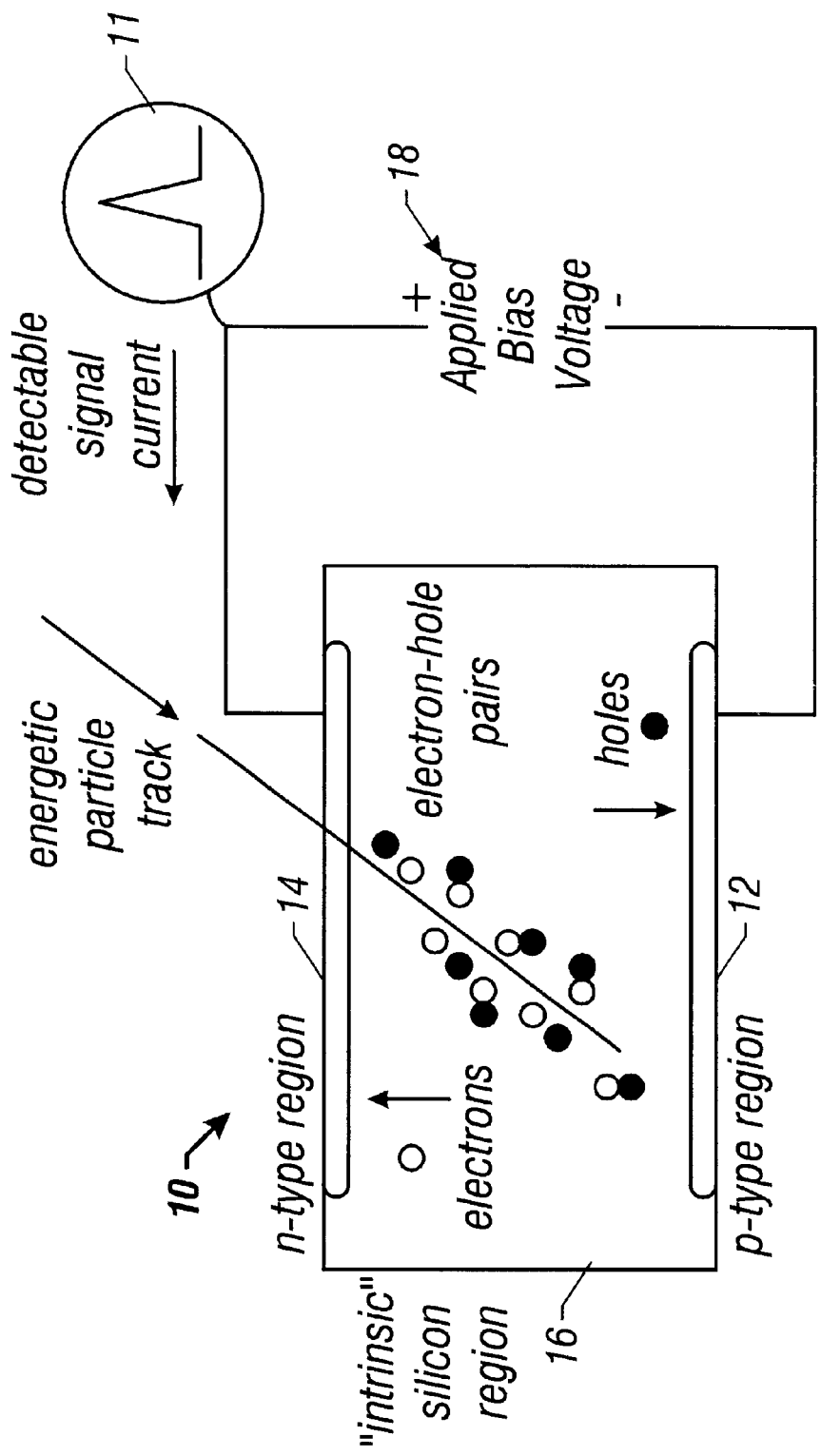
FIG. 1 shows a known silicon PIN diode for detecting energetic particles.
Figure 2:
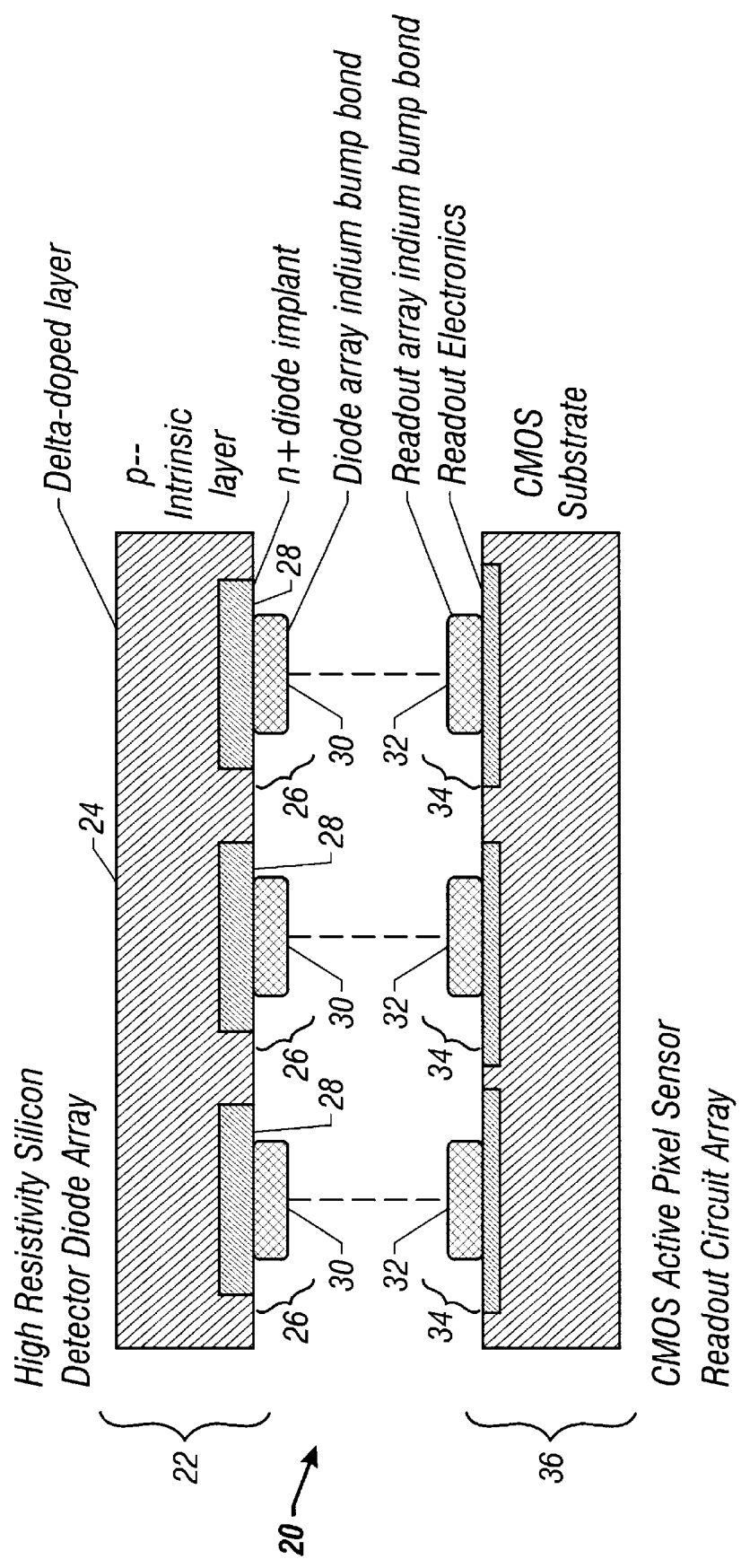
FIG. 2 shows a schematic cross-section of the delta-doped HAD. The detector diode array is connected through indium bump bonds to a CMOS APS readout electronics chip.

The structure of the delta-doped HAD 20 according to an embodiment of the present invention is shown in FIG. 2. A detector diode array 20 according to an embodiment of the present invention is fabricated from high-resistivity silicon connected through indium bump bonds to a readout array fabricated using a standard foundry CMOS process.

The diode array 20 is fabricated from a wafer of high resistivity silicon approximately 300 $\mu$m thick that is very lightly p-doped, to a concentration of about $10^{12}$ dopant atoms per cubic centimeter. A bulk 22 of this wafer remains undoped, and forms the intrinsic or "I" region. An exposed first surface 24 of the diode array 20 is uniformly delta-doped with dopants of a first conductivity, such as boron, forming a continuous "P" region. The opposite second side of the wafer is pixelated into a number of separate diodes 26 using a number of dopants of a second conductivity, in this case n+ implants 28, forming the "N" regions. Together, these structures form an array of PIN diodes 26.

By applying a voltage of approximately 100 V, the lightly doped intrinsic region can be completely depleted, resulting in an electric field across its entire 300 $\mu$m thickness. Carriers generated in the intrinsic region are swept out by this electric field to form the signal current.

There is an indium bump 30 on each of the n+ diodes 26, and a corresponding indium bump 32 in each pixel 34 of the readout chip 36. The two chips 20 and 36 are aligned and pressure is applied, which pressure welds the corresponding indium bumps 30 and 32 together. This connects the diode array chip 20 and the CMOS APS readout chip 36 both electrically and mechanically, resulting in a hybrid.

Figure 3:
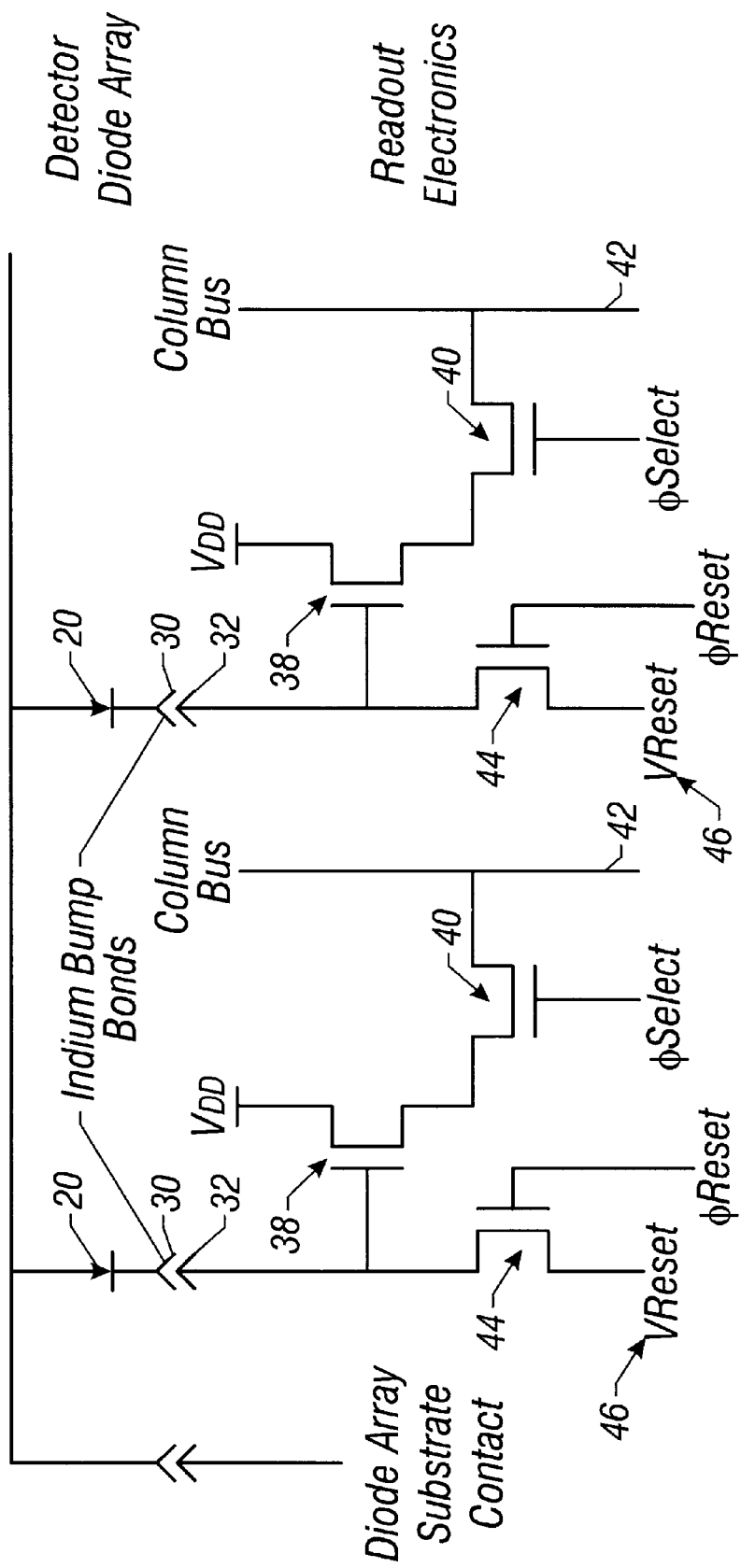
FIG. 3 shows an electrical schematic cross-section of the delta-doped HAD, including the detector diode array, bump bonds, and readout electronics.

An electrical schematic is shown in FIG. 3. The readout chip 36 uses a single transistor 38 connected as a source-follower in each readout pixel to buffer the signal from the diode array 20. The n+ implant 28 of the diode array 20 is connected through the bump bond 30 and 32 to the gate of this source-follower 38. A select transistor 40 is located in each pixel and acts as a switch. When enabled in turn, the select transistor 40 connects the source of the buffer transistor 38 to a common column bus 42 for output. There is also a reset transistor 44 connecting the buffer transistor 38 gate to a common reset voltage 46. When enabled, the reset transistor 46 drains off any signal charge, and restores the gate and diode to the reset voltage level.

1. Pixelated High-Resistivity Silicon Diodes

The detector diodes 26 are fabricated from a chip of high resistivity silicon. The low doping of the chip allows the active depletion region to extend through the entire 300 $\mu$m thickness of the chip, providing a large depletion depth for the detection of high energy particles and X-rays. The large depletion depth also eliminates the need for wafer thinning of the detector.

In addition, the detector diode chip may be divided into square pixels rather than long strips. Square pixels reduce the area of the diode resulting in a reduction of the capacitance. The capacitance of a 50 $\mu$m×50 $\mu$m diode with a 300 $\mu$m depletion depth (using the relative dielectric constant of silicon of 11.8) is about 0.87 femtofarads.

2. Delta-Doping

The exposed surface of the high resistivity silicon is delta-doped. Delta-doping greatly decreases the dead layer at the detector surface, and allows the collection of charge from low energy particles 54 and UV photons 56 that produce charge very near the surface.

Figure 4:
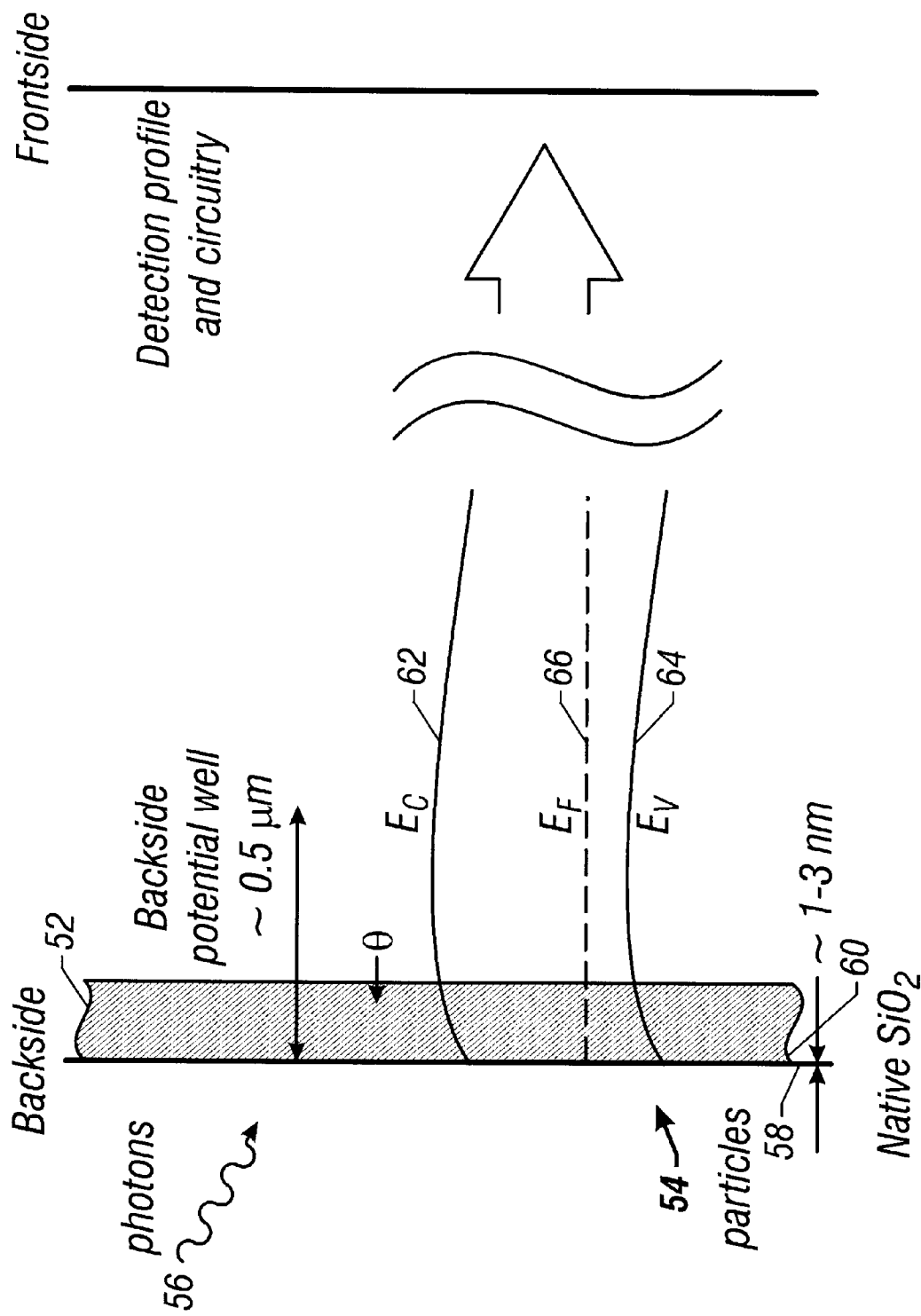
FIG. 4 shows a schematic cross-section and band structure of a detector before delta doping.

A schematic cross section and band structure of a detector structure without delta doping is shown in FIG. 4. A native oxide layer 58 is apparent on the exposed surface 60 of the chip. A backside potential well 52 of at least 0.5 $\mu$m exists that acts as a dead layer. The potential well traps carriers created near the surface 60, making the detector blind to UV photons and low energy particles. FIG. 4 also shows the conduction band 62, the valence band 64, and the Fermi level 66.

Figure 5:
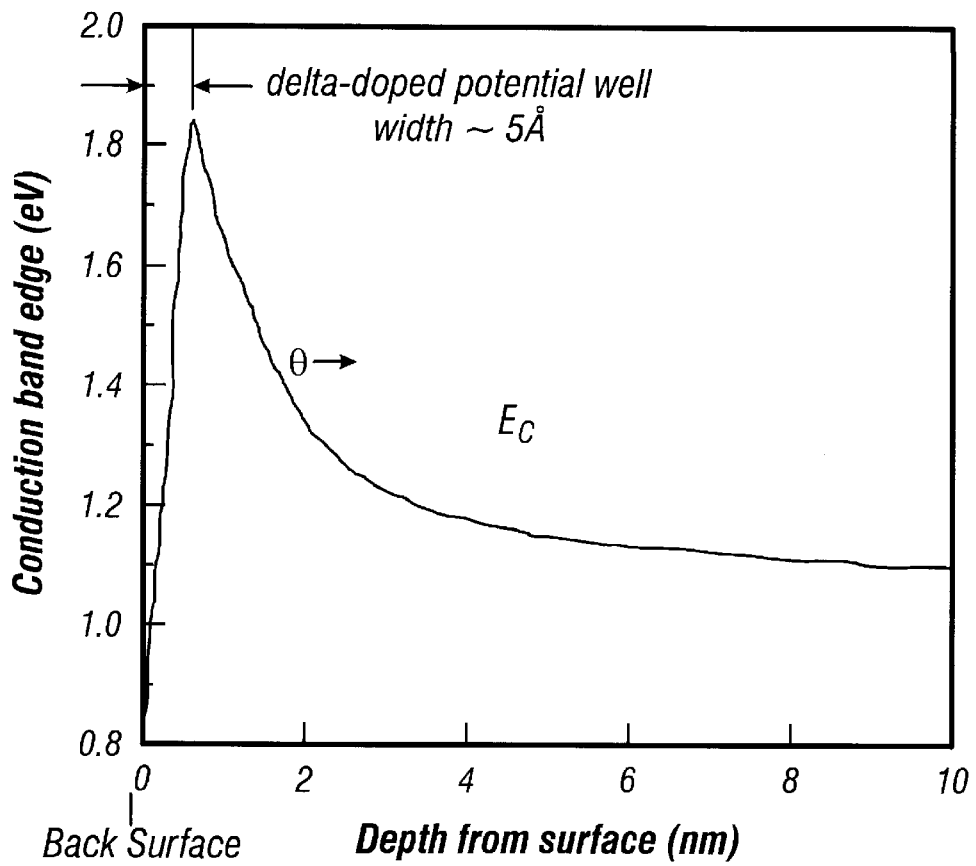
FIG. 5 shows a schematic cross-section of a detector diode after delta doping.

The resulting potential well after delta-doping is shown in FIG. 5. As may be seen in that figure, the backside dead layer is reduced to a few angstroms.

Figure 6:
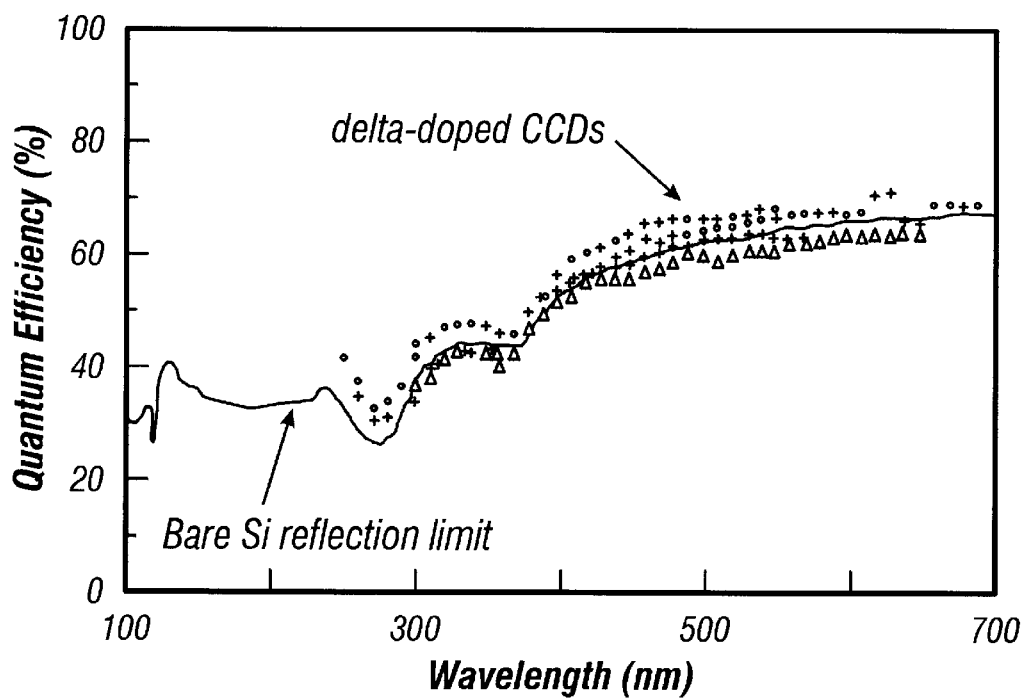
FIG. 6 shows a plot of the quantum efficiency of a thinned, backside-illuminated, and delta-doped CCD as a function of incident light wavelength.

The resulting effect on quantum efficiency for UV photons is demonstrated in FIG. 6. FIG. 6 shows a plot of quantum efficiency versus wavelength for a thinned, back-illuminated CCD with delta-doping. The plot shows that the delta-doped detector is sensitive to wavelengths at least down to Lyman α (121.6 nm), and may extend indefinitely beyond that into the X-rays, where the absorption depth dependence reverses, increasing with decreasing wavelength. Without delta-doping, the CCD would cut off at wavelengths longer than 400 nm.

Recently, delta-doping has also been shown to dramatically reduce the low energy cut-off for detecting low energy particles. In typical silicon strip detectors, the particle energies must be greater than about 10 keV to penetrate the detector dead layer and be detected. Delta-doped CCDs are able to detect and provide energy resolution of low energy protons down to 1 keV, and of low energy electrons down to 50 eV.

3. Readout using CMOS Active Pixel Sensor Electronics

Figure 7:
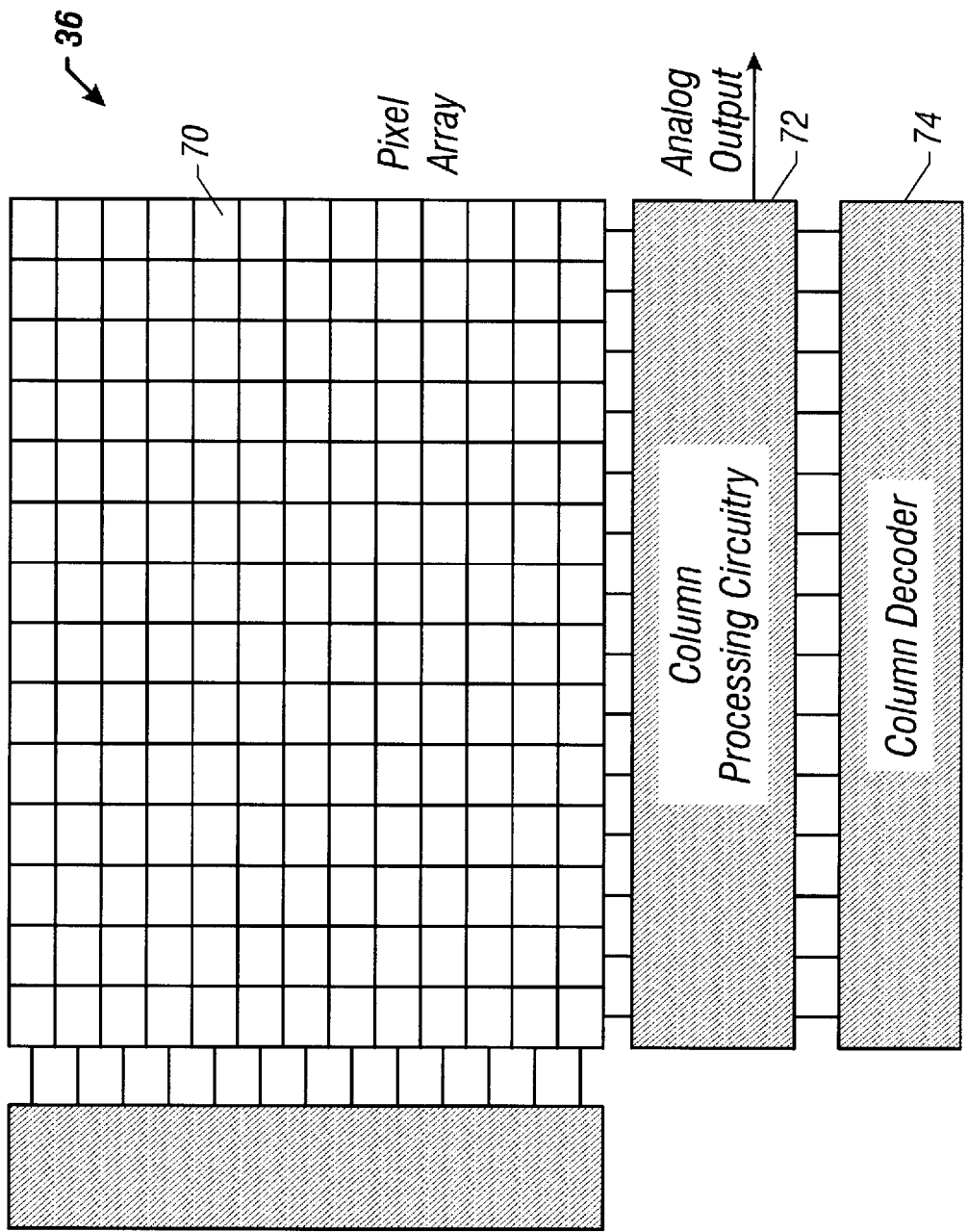
FIG. 7 shows a layout of a CMOS APS readout chip according to an embodiment of the present invention.

The diode array 20 is connected by a moldable metal contact, such as by bump bonding, to a CMOS APS readout on chip 36. An APS readout chip 36 may be fabricated using a standard process available from a commercial CMOS foundry. The schematic of the pixel electronics is shown in FIG. 3. The layout of the readout chip 36 is shown in FIG. 7. FIG. 7 shows chip 36 including a pixel array 70, column processing circuitry 72, and a column decoder 74. Ordinary digital logic is used to raster scan through the pixel array. The column processing circuitry 72 may provide for direct incorporation of features such as double correlated sampling.

The CMOS APS readout chip 36 may use only milliwatts of power, as compared to watts for a typical CCD. It also allows a more flexible readout scheme than the strictly sequential readout used by a CCD. Like the CCD, however, the CMOS APS readout chip 36 can preserve the low capacitance of the detector diodes, resulting in a read noise of 10 electrons or less, as opposed to hundreds or thousands of electrons read noise for a conventional strip detector.

4. Guarded Bump Bond Connectors

A guarding technique may be used to reduce the capacitance associated with the readout. This technique is shown in the prior art FIG. 8(a).

Figures 8A, 8B:
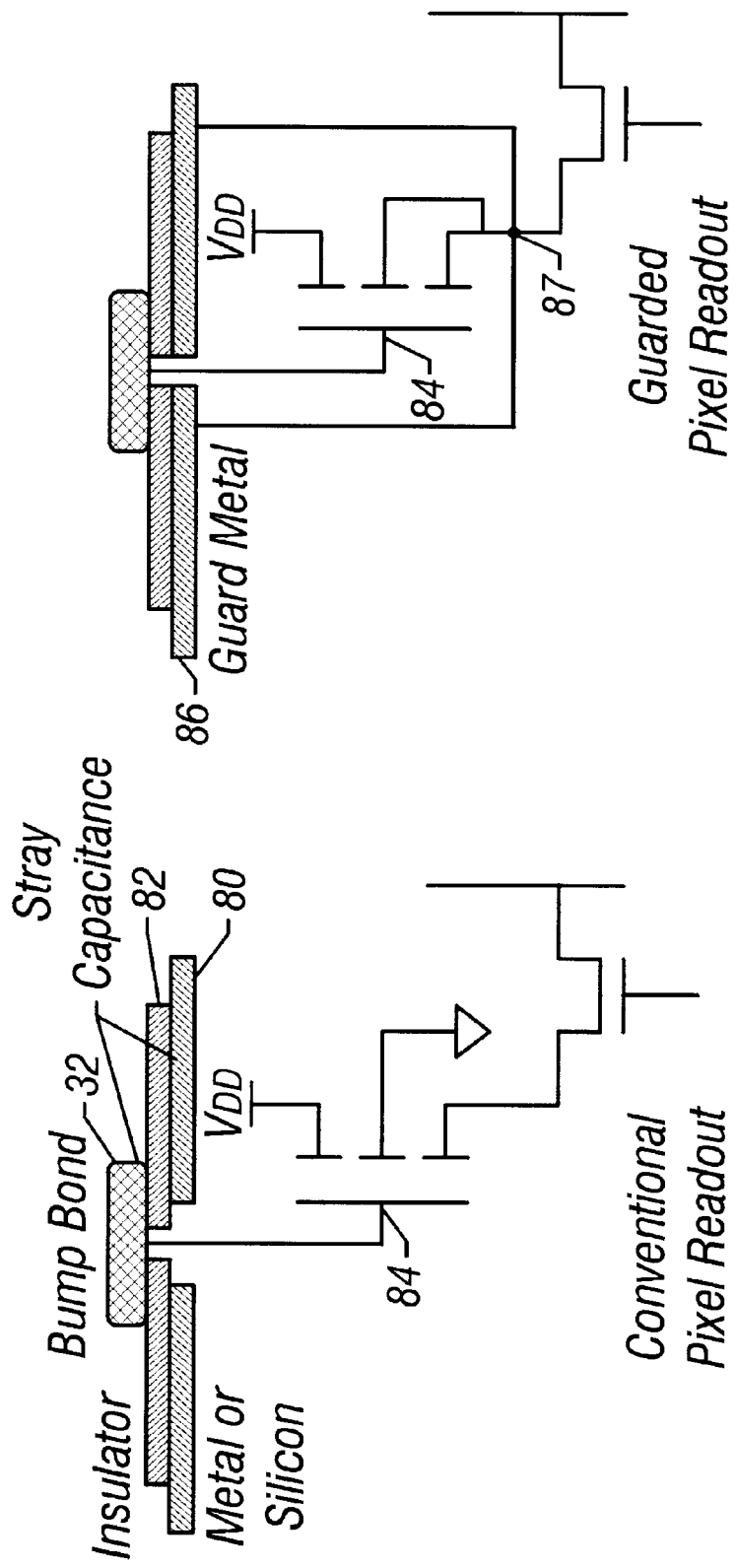
FIG. 8(a) shows a schematic of a prior art readout pixel.
FIG. 8(b) shows a schematic of a guarded bump-bonded pixel according to an embodiment of the present invention.

In prior art FIG. 8(a), the bump-bond 32 is separated from a metallization layer 80 by an insulator 82. The bump-bond 32 connects to a source-follower which serves as a near-unity-gain buffer.

In the guarded pixel technique shown in FIG. 8(b), the output of this buffer is used to power a guard metal layer 86 that lies underneath the bump bond metallization. Each pixel may have its own guard metal. By actively forcing the area around the bond to follow the bond potential, the effect of parasitic capacitance is reduced by $(1-A_v)$, where $A_v$ is the gain of the source-follower 84. In the absence of the feedback, the detector capacitance would be very high causing a large increase in noise. The body of the source-follower is also tied to the source, to reduce the body effect, and make the gain closer to unity.

The guarded pixel readout provides a detector with high signal-to-noise ratio ("SNR"). The high SNR is accomplished by minimizing the detector capacitance through feedback from a node 87 into the guarded metal.

Although the present invention has been described with respect to specific embodiments, those skilled in the art will recognize that variations of the embodiments also fall within the scope of the present invention. For example, while the device described is envisioned as a bump-bonded hybrid, it is also possible to make a monolithic detector using a CMOS-compatible process starting with high-resistivity silicon substrates. Accordingly, the scope of the present invention is limited only by the claims appended hereto.

What is claimed is:

1. An image sensor, comprising:
    a diode array, having first and second surfaces, said first surface being a Delta doped surface, doped by an amount that is effective to allow the diode array to detect ultraviolet radiation;
    a readout chip, formed using CMOS circuitry, separate from said diode array and including a plurality of circuit elements; and
    a plurality of bump bond elements, connected between said diode array and said readout chip, and connecting outputs of individual elements of said diode array to corresponding elements of said readout chip.

2. A sensor as in claim 1, wherein said diode array is formed of PIN diodes, each diode of said diode array having a P portion, which is doped with P type dopants, an intrinsic portion, and an N portion which is doped with an N type dopant.

3. A sensor as in claim 1, wherein said diode array has a dead layer formed by native oxide which is less than 0.5 microns in thickness.

4. A sensor as in claim 1, wherein said diode array has a dead layer formed by native oxide which is less than five angstroms in thickness.

5. A sensor as in claim 1, wherein said diode array is sensitive to at least a plurality of wavelengths longer than 400 nm.

6. A sensor as in claim 1, wherein said diode array is sensitive to particles having an energy less than 10 keV.

7. A sensor as in claim 1, wherein said diode array is sensitive to particles having an energy less than 1 keV.

8. A method, comprising:
    forming an array of diodes on a first silicon substrate;
    Delta doping a surface of the silicon substrate, by an amount effective to render the silicon substrate sensitive to wavelengths longer than 400 nm; and
    forming a plurality of CMOS readout circuits on a second substrate, separate from said first substrate; and bump bonding each of the diodes in said diode array to each of the readout circuits in the readout array.

9. A method as in claim 8, wherein said Delta doping comprises doping one of the surfaces of the semiconductor substrate by an amount effective to reduce a thickness of a native oxide layer.

10. A method as in claim 8, wherein said Delta doping is carried out by an amount effective to extend the sensor to wavelengths at least as low as 121.6 nm.

11. A method as in claim 8, further comprising using said readout circuits to produce outputs indicative of signals received by said array of said diodes, and to consume milliwatts of electricity or less.

* * * * *